United States Patent
Ueda et al.

(10) Patent No.: US 12,283,498 B2
(45) Date of Patent: Apr. 22, 2025

(54) LIGHT IRRADIATION TYPE HEAT TREATMENT APPARATUS

(71) Applicant: SCREEN Holdings Co., Ltd., Kyoto (JP)

(72) Inventors: Akitsugu Ueda, Kyoto (JP); Hiroshi Miyake, Kyoto (JP); Kazuhiko Fuse, Kyoto (JP); Hideaki Tanimura, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 856 days.

(21) Appl. No.: 17/465,038

(22) Filed: Sep. 2, 2021

(65) Prior Publication Data

US 2022/0076970 A1   Mar. 10, 2022

(30) Foreign Application Priority Data

Sep. 9, 2020   (JP) .................................. 2020-151226

(51) Int. Cl.
   *H01L 21/67*   (2006.01)
(52) U.S. Cl.
   CPC .............................. *H01L 21/67115* (2013.01)
(58) Field of Classification Search
   USPC ....................................................... 392/416
   See application file for complete search history.

(56) References Cited

U.S. PATENT DOCUMENTS 10,727,093 B2 *   7/2020   Brillhart ................ G02B 6/08
2001/0034004 A1   10/2001   Kitamura
(Continued)

FOREIGN PATENT DOCUMENTS

JP   2001-308022 A   11/2001
JP   2004-140318 A   5/2004
(Continued)

OTHER PUBLICATIONS

Notice of Reasons for Refusal dated Jun. 11, 2024 in corresponding Japanese Patent Application No. 2020-151226 and English machine language translation obtained from the JPO.
(Continued)

*Primary Examiner* — Steven W Crabb
*Assistant Examiner* — Thomas J Ward
(74) *Attorney, Agent, or Firm* — OSTROLENK FABER LLP

(57) ABSTRACT

A light diffusion plate is placed on an upper surface of an upper chamber window. A blasting process is applied to a lower surface of the light diffusion plate to provide the lower surface in the form of frosted glass. When the light diffusion plate is placed on the upper surface of the upper chamber window, the light diffusion plate and the upper chamber window do not closely adhere to each other. The frosted glass releases a mass of air entering between contact surfaces of the light diffusion plate and the upper chamber window to the outside even if the mass of air thermally expands during heat treatment. This restrains the occurrence of a phenomenon in which a thin layer of air is trapped between the light diffusion plate and the upper chamber window to prevent the sliding of the light diffusion plate resulting from the air layer.

2 Claims, 8 Drawing Sheets

(56) References Cited

U.S. PATENT DOCUMENTS

| | | | | |
|---|---|---|---|---|
| 2004/0037543 A1* | 2/2004 | Kusuda | ............ | H01L 21/67115 |
| | | | | 392/416 |
| 2018/0301360 A1 | 10/2018 | Nishide | | |
| 2019/0019697 A1* | 1/2019 | Miyake | ............ | H01L 21/68707 |
| 2019/0141790 A1 | 5/2019 | Ito | | |
| 2022/0051915 A1 | 2/2022 | Nishide | | |

FOREIGN PATENT DOCUMENTS

| | | | |
|---|---|---|---|
| JP | 2004-179510 A | 6/2004 |
| JP | 2009-246061 A | 10/2009 |
| JP | 2018-182153 A | 11/2018 |
| JP | 2019-021738 A | 2/2019 |
| KR | 10-2010-0138984 A | 12/2010 |
| KR | 10-2018-0117053 A | 10/2018 |
| KR | 10-2019-0051859 A | 5/2019 |

OTHER PUBLICATIONS

Request for the Submission of an Opinion dated May 1, 2023 in corresponding Korean Patent Application No. 10-2021-0116867 and a machine English translation obtained from the Global Dossier.
Notice of Decision to Grant dated Nov. 28, 2023 in corresponding Korean Patent Application No. 10-2021-0116867.

* cited by examiner

LIGHT IRRADIATION TYPE HEAT TREATMENT APPARATUS

BACKGROUND OF THE INVENTION

Field of the Invention

The present invention relates to a heat treatment apparatus which irradiates a thin plate-like precision electronic substrate (hereinafter referred to simply as a "substrate") such as a semiconductor wafer with light to heat the substrate.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of a surface of a semiconductor wafer implanted with impurities by an ion implantation process with a flash of light emitted from flash lamps allows the temperature rise only in the surface of the semiconductor wafer to an activation temperature for an extremely short time, thereby achieving only the activation of the impurities without deep diffusion of the impurities.

In a heat treatment apparatus employing such flash lamps, the flash lamps are disposed in a region considerably larger than the area of a semiconductor wafer, yet the illuminance of a peripheral portion of the semiconductor wafer tends to be lower than that of a central portion thereof. As a result, the in-plane distribution of illuminance becomes nonuniform, which in turn causes variations in temperature distribution.

For the purpose of eliminating the nonuniformity of such an illuminance distribution, U.S. Patent Application Publication No. 2018/0301360 discloses the provision of a light diffusion plate made of quartz and provided with a plurality of recessed or protruding curved surfaces. The light diffusion plate made of quartz is placed on the upper surface of a chamber window made of quartz. The light diffusion plate diffuses part of incident light toward a peripheral portion of a semiconductor wafer to thereby increase the in-plane uniformity of the illuminance distribution on the semiconductor wafer.

The aforementioned chamber window is made of transparent quartz, and the light diffusion plate is also made of transparent quartz. When the light diffusion plate is placed on the upper surface of the chamber window, the transparent quartz of the chamber window and the transparent quartz of the light diffusion plate come in contact with each other. At this time, minute flaws in the surfaces cause a mass of air to enter between the contact surfaces in some cases. As the semiconductor wafer is heat-treated, the air mass is also heated to a higher temperature to thermally expand. As a result, a thin layer of air is trapped between the chamber window and the light diffusion plate to give rise to a problem such that the light diffusion plate slips and moves.

SUMMARY

The present invention is intended for a heat treatment apparatus for heating a substrate by irradiating the substrate with light.

According to one aspect of the present invention, the heat treatment apparatus comprises: a chamber for receiving a substrate therein; a holder for holding the substrate in the chamber; a light irradiation part provided over the chamber and for irradiating the substrate held by the holder with light; a quartz window provided in an upper portion of the chamber and for transmitting light emitted from the light irradiation part therethrough into the chamber; a light diffusion plate placed on an upper surface of the quartz window and for diffusing the light emitted from the light irradiation part; and an air escape mechanism for allowing air remaining on contact surfaces of the quartz window and the light diffusion plate to escape, the air escape mechanism being provided in the quartz window or in the light diffusion plate.

The air escape mechanism releases air remaining on contact surfaces of the quartz window and the light diffusion plate to the outside even if the air thermally expands during the heat treatment of the substrate. This prevents the sliding of the light diffusion plate resulting from a layer of air.

According to another aspect of the present invention, the heat treatment apparatus comprises: a chamber for receiving a substrate therein; a holder for holding the substrate in the chamber; a light irradiation part provided over the chamber and for irradiating the substrate held by the holder with light; a quartz window provided in an upper portion of the chamber and for transmitting light emitted from the light irradiation part therethrough into the chamber; and a plurality of light diffusion plates provided in a stacked relation on an upper surface of the quartz window and for diffusing the light emitted from the light irradiation part, the plurality of light diffusion plates being provided with an air escape mechanism for allowing air remaining on contact surfaces of the plurality of light diffusion plates to escape.

The air escape mechanism releases air remaining on contact surfaces of the plurality of light diffusion plates to the outside even if the air thermally expands during the heat treatment of the substrate. This prevents the sliding of the light diffusion plates resulting from a layer of air.

It is therefore an object of the present invention to prevent a light diffusion plate from sliding.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments according to the present invention will now be described in detail with reference to the drawings.

First Preferred Embodiment

Figure 1:
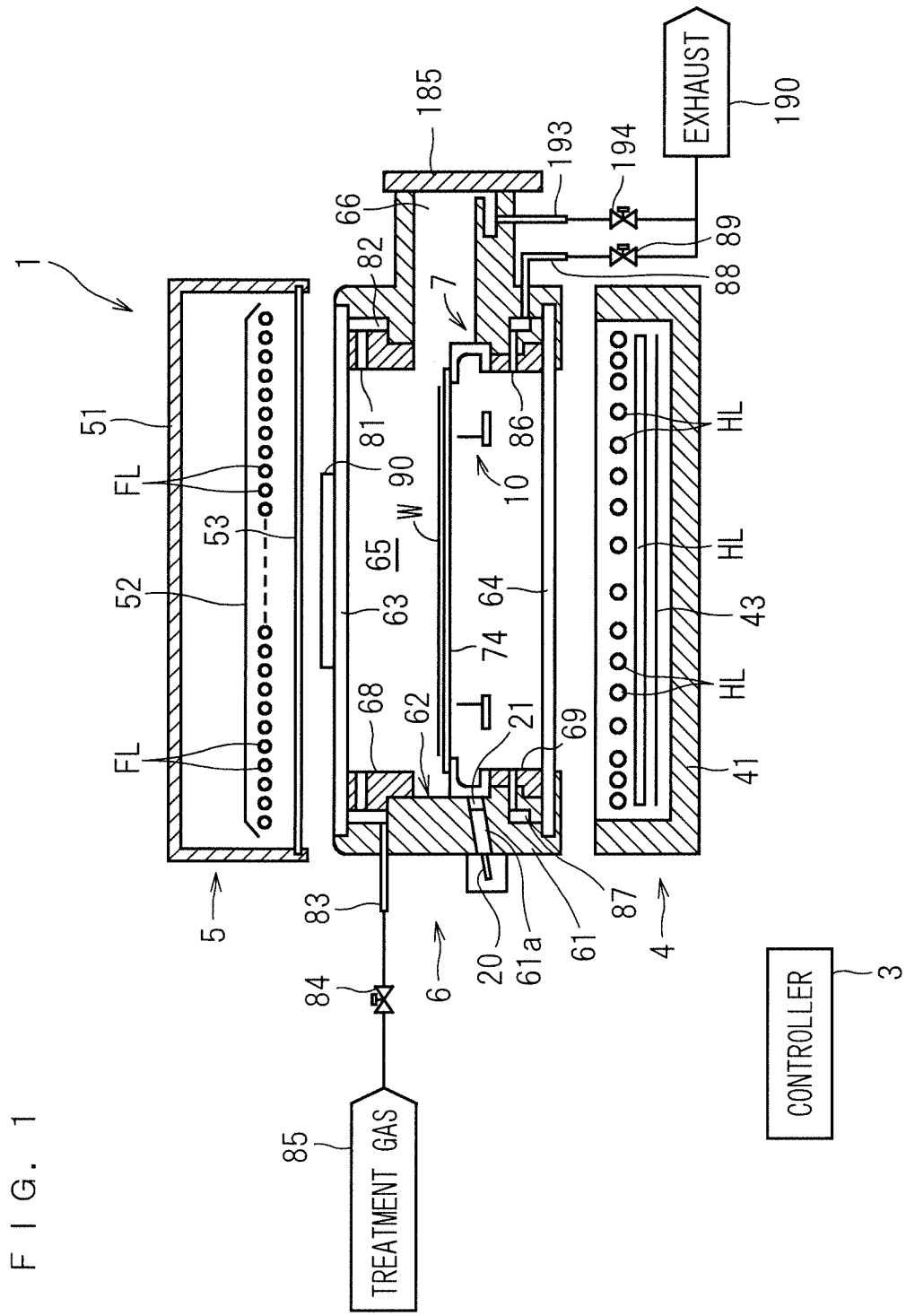
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a bored therein. A radiation thermometer 20 is mounted in a location of an outer wall surface of the chamber side portion 61 where the through hole 61a is provided. The through hole 61a is a cylindrical hole for directing infrared radiation emitted from a lower surface of a semiconductor wafer W held by a susceptor 74 to be described later therethrough to the radiation thermometer 20. The through hole 61a is inclined with respect to a horizontal direction so that a longitudinal axis (an axis extending in a direction in which the through hole 61a extends through the chamber side portion 61) of the through hole 61a intersects a main surface of the semiconductor wafer W held by the susceptor 74. A transparent window 21 made of barium fluoride material transparent to infrared radiation in a wavelength range measurable with the radiation thermometer 20 is mounted to an end portion of the through hole 61a which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is interposed in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in the present preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 193 for exhausting the gas from the heat treatment space 65 is also connected to a distal end of the transport opening 66. The gas exhaust pipe 193 is connected through a valve 194 to the exhaust part 190. By opening the valve 194, the gas in the chamber 6 is exhausted through the transport opening 66.

Figure 2:
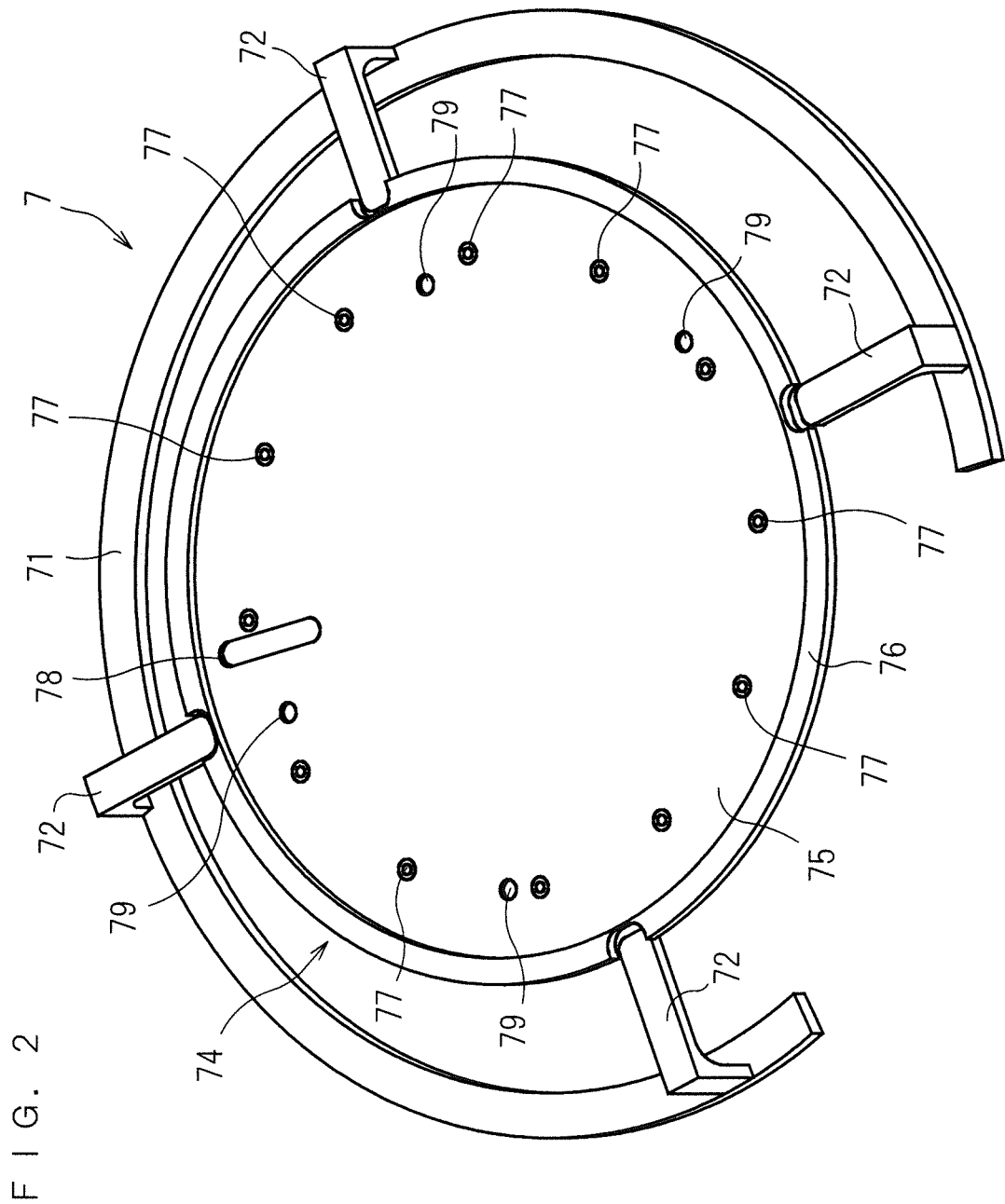
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 3:
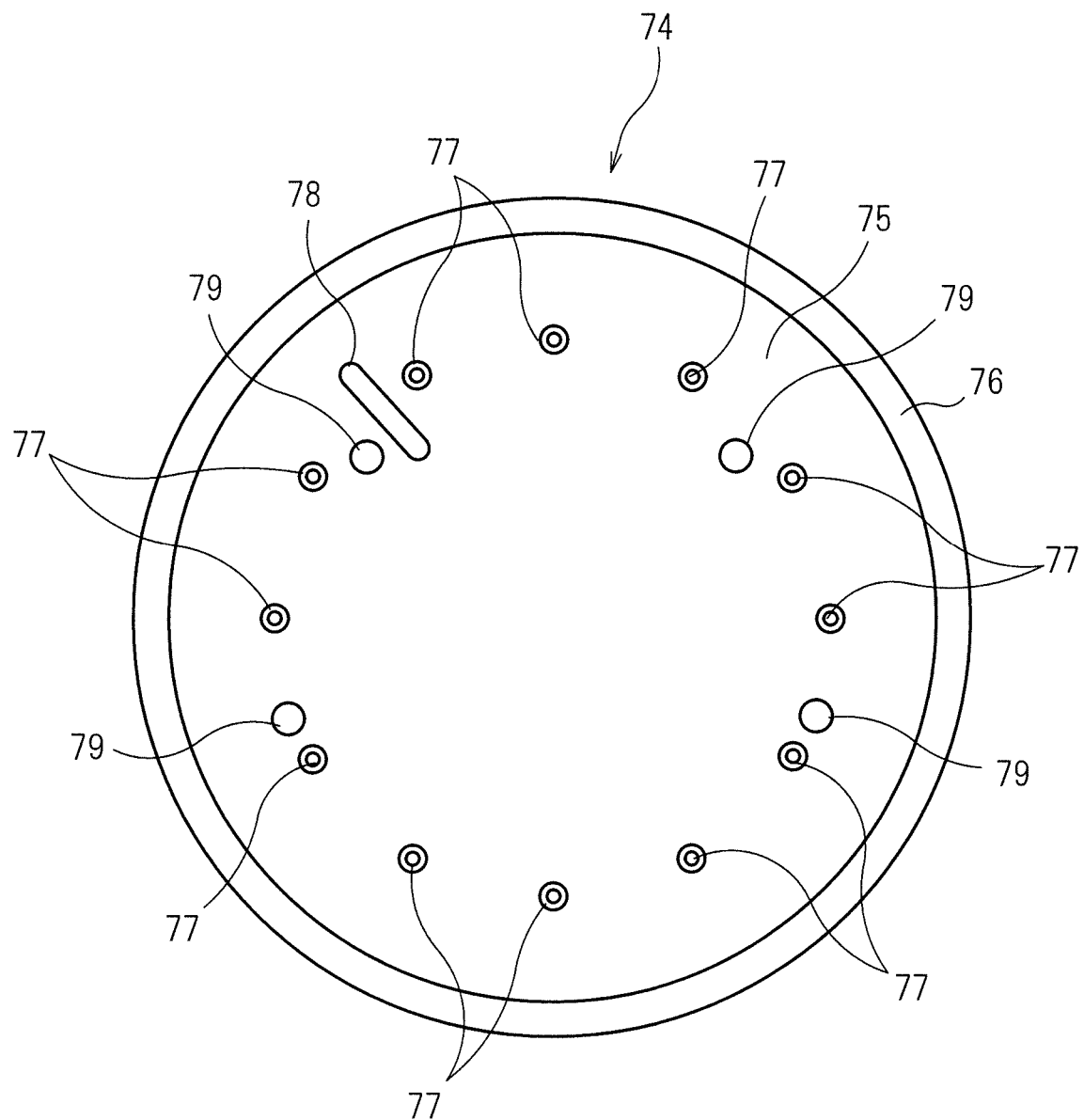
FIG. 3 is a plan view of a susceptor.
Figure 4:
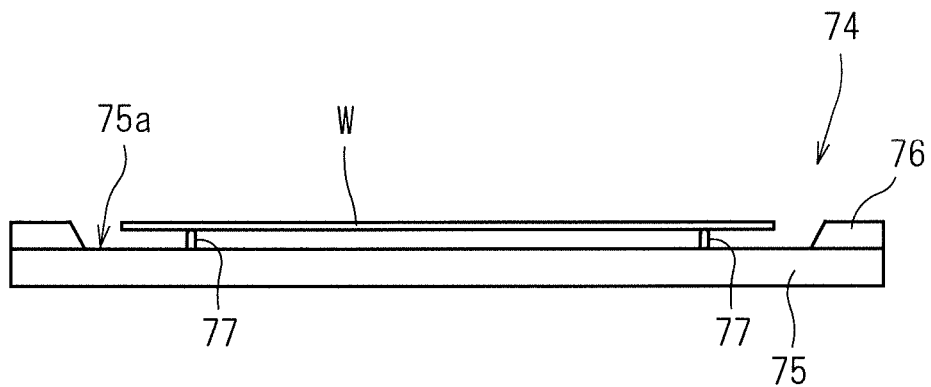
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is provided in the holding plate 75 of the susceptor 74 so as to extend vertically through the holding plate 75 of the susceptor 74. The opening 78 is provided for the radiation thermometer 20 to receive radiation (infrared radiation) emitted from the lower surface of the semiconductor wafer W. Specifically, the radiation thermometer 20 receives the radiation emitted from the lower surface of the semiconductor wafer W through the opening 78 and the transparent window 21 mounted to the through hole 61a in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
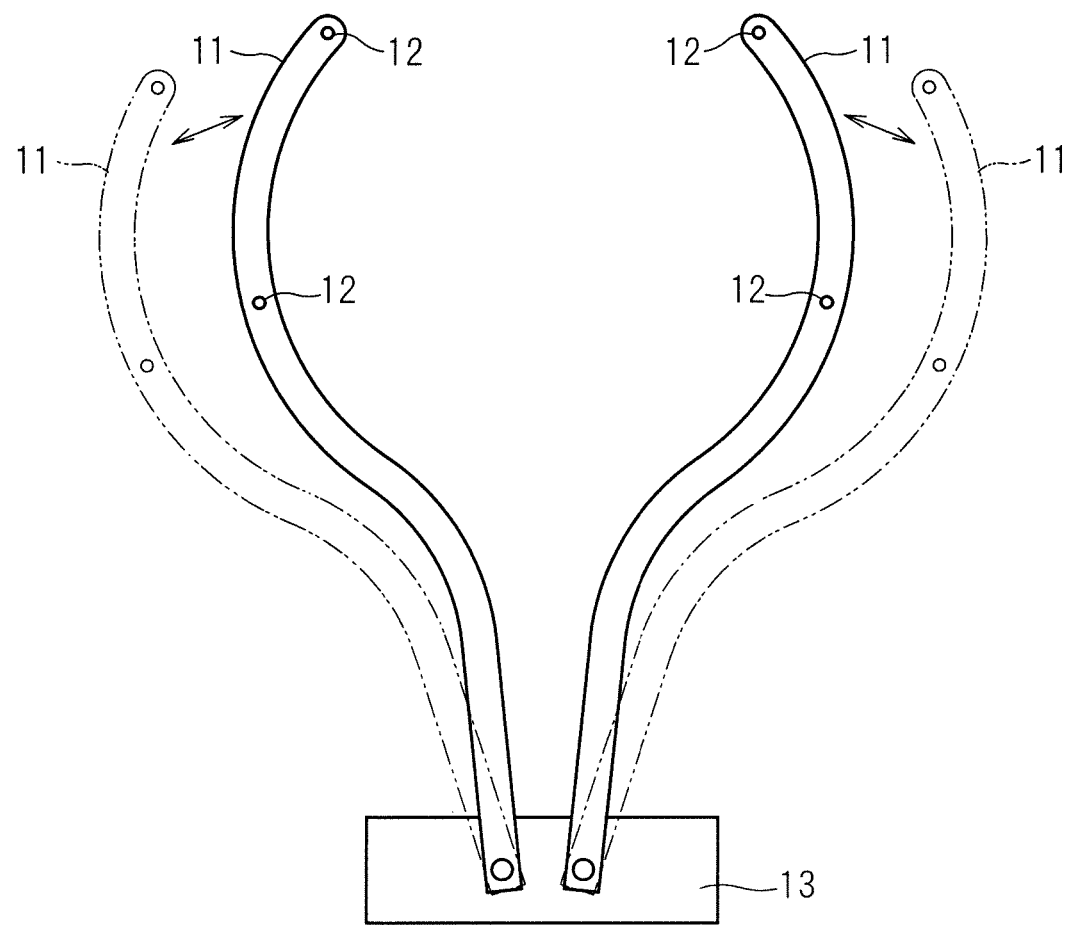
FIG. 5 is a plan view of a transfer mechanism.
Figure 6:
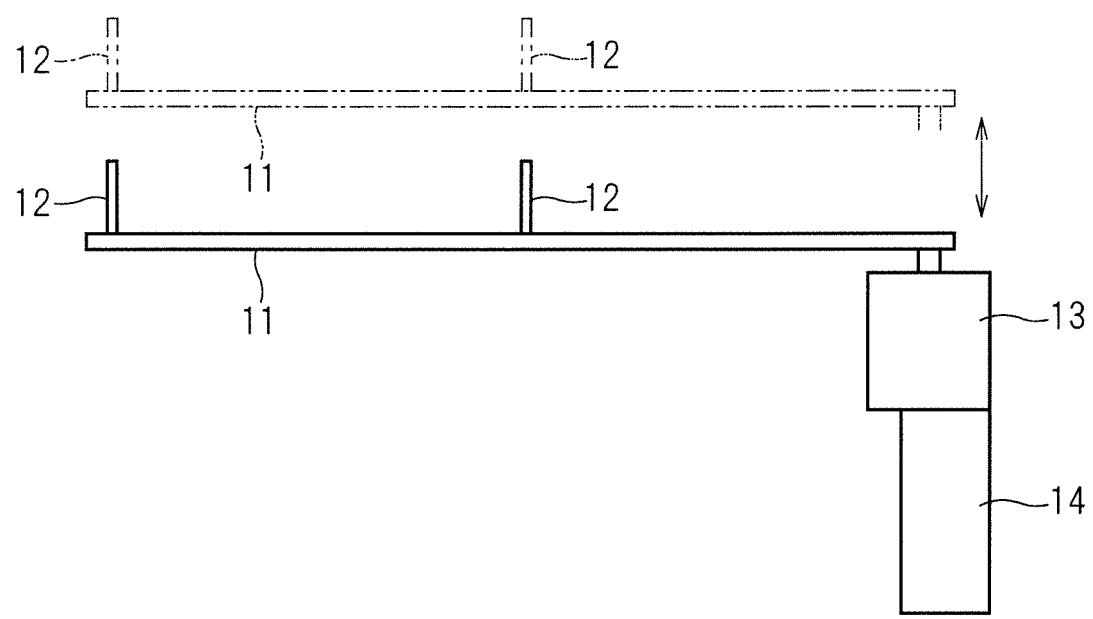
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane. A region in which the flash lamps FL are arranged has a size, as seen in plan view, greater than that of the semiconductor wafer W.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating the multiple (in the present preferred embodiment, 40) halogen lamps HL. The halogen heating part 4 directs light from under the chamber 6 through the lower chamber window 64 toward the heat treatment space 65 to heat the semiconductor wafer W by means of the halogen lamps HL.

Figure 7:
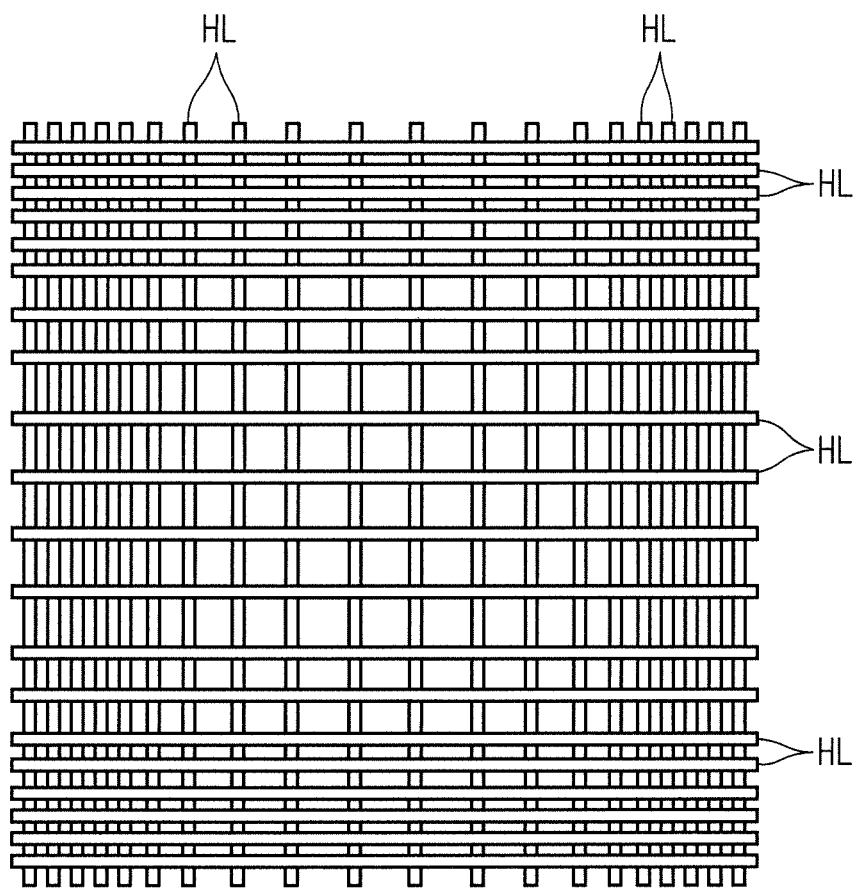
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

As shown in FIG. 1, a light diffusion plate 90 is provided on an upper surface of the upper chamber window 63 provided in an upper portion of the chamber 6. The light diffusion plate 90 is a quartz plate having an upper surface provided with a plurality of recessed surfaces or protruding surfaces. In other words, the whole of the light diffusion plate 90 is made of quartz. The light diffusion plate 90 has a size, as seen in plan view, smaller than that of the semiconductor wafer W.

The light diffusion plate 90 is placed on the upper chamber window 63 so that the central axis of the light diffusion plate 90 coincides with the central axis of the semiconductor wafer W held by the holder 7. The light diffusion plate 90 is provided in opposed relation to the central portion of the semiconductor wafer W because the light diffusion plate 90 is smaller in size as seen in plan view than the semiconductor wafer W.

Flashes of light emitted from the plurality of flash lamps FL and entering the light diffusion plate 90 are diffused by the recessed or protruding surfaces to impinge upon a front surface of the semiconductor wafer W held by the holder 7. Thus, some of the flashes of light entering the light diffusion plate 90 impinge also upon the peripheral portion of the semiconductor wafer W.

In the first embodiment, a blasting process is applied to a lower surface of the light diffusion plate 90 to provide the lower surface in the form of frosted glass. Thus, the light diffusion plate 90 is in contact with the upper chamber window 63 via the frosted glass of the lower surface thereof.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like thereon. The CPU in the controller 3 executes a predetermined processing program, whereby the processes in the heat treatment apparatus 1 proceed.

The heat treatment apparatus 1 further includes, in addition to the aforementioned components, various cooling structures to prevent an excessive temperature rise in the halogen heating part 4, the flash heating part 5, and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with a flash of light. The procedure for the treatment in the heat treatment apparatus 1 which will be described below proceeds under the control of the controller 3 over the operating mechanisms of the heat treatment apparatus 1.

First, the valve 84 for supply of gas is opened, and the valves 89 and 194 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 194. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W subjected to the ion implantation through the transport opening 66 into the heat treatment space 65 of the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between a back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the radiation thermometer 20 when the halogen lamps HL perform the preheating. Specifically, the radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the radiation thermometer 20. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in the peripheral portion thereof where heat dissipation is liable to occur than in the central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at the point in time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs.

In this preferred embodiment, the light diffusion plate 90 is placed on the upper surface of the upper chamber window 63. The light diffusion plate 90 is placed on the upper chamber window 63 so that the central axis of the light diffusion plate 90 coincides with the central axis of the semiconductor wafer W held by the holder 7. The light diffusion plate 90 is smaller in size as seen in plan view than the semiconductor wafer W. Thus, flashes of light emitted from the flash lamps FL and passing by the side of the light diffusion plate 90 are transmitted through the upper chamber window 63 to impinge upon the peripheral portion of the semiconductor wafer W.

On the other hand, flashes of light emitted from the flash lamps FL and entering the light diffusion plate 90 are diverged by the recessed or protruding surfaces formed on the upper surface of the light diffusion plate 90. The light diffusion plate 90 as a whole diffuses some of the flashes of light entering the light diffusion plate 90 toward the outside of the light diffusion plate 90, i.e. toward the peripheral portion of the semiconductor wafer W. As a result, the amounts of flashes of light directed toward the central portion of the semiconductor wafer W are decreased by the amounts of flashes of light diffused toward the outside of the light diffusion plate 90. This decreases the amount of light impinging upon the central portion of the semiconductor wafer W which tends to have relatively high illuminance when irradiated with flashes of light without the provision of the light diffusion plate 90, and increases the amount of light impinging upon the peripheral portion of the semiconductor wafer W which tends to have relatively low illuminance, so that flashes of light uniformly impinge upon the entire surface of the semiconductor wafer W. This increases the in-plane uniformity of an illuminance distribution on the semiconductor wafer W to achieve a uniform in-plane temperature distribution of the front surface thereof.

After a predetermined time period has elapsed since the completion of the flash heating treatment, the halogen lamps HL turn off. This causes the temperature of the semiconductor wafer W to decrease rapidly from the preheating temperature T1. The radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 out of the chamber 6. Thus, the heat treatment apparatus 1 completes the heating treatment of the semiconductor wafer W.

Figure 8:
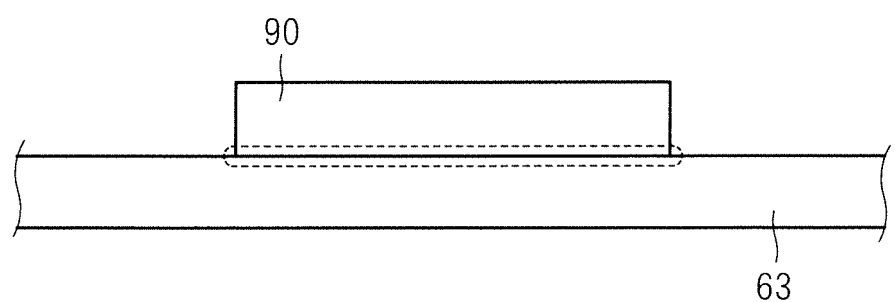
FIG. 8 is a view showing a light diffusion plate placed on an upper chamber window.

FIG. 8 is a view showing the light diffusion plate 90 placed on the upper chamber window 63. The light diffusion plate 90 made of transparent quartz is placed on the upper surface of the upper chamber window 63 made of transparent quartz. When the light diffusion plate 90 is placed on the upper chamber window 63, there are cases in which a mass of air enters between contact surfaces of the light diffusion plate 90 and the upper chamber window 63 enclosed by dotted lines in FIG. 8.

In the first preferred embodiment, the lower surface of the light diffusion plate 90 is in the form of frosted glass. Thus, when the light diffusion plate 90 is placed on the upper chamber window 63, the light diffusion plate 90 and the upper chamber window 63 do not closely adhere to each other, and the light diffusion plate 90 is provided with an air escape mechanism that allows air remaining on the contact surfaces of the light diffusion plate 90 and the upper chamber window 63 to escape. Thus, the air escape mechanism releases a mass of air entering between the contact surfaces to the outside even if the mass of air thermally expands during the heat treatment of the semiconductor wafer W. As a result, this restrains the occurrence of a phenomenon in which a thin layer of air is trapped between the light diffusion plate 90 and the upper chamber window 63 to prevent the sliding of the light diffusion plate 90 resulting from the air layer.

Second Preferred Embodiment

Next, a second preferred embodiment according to the present invention will be described. The heat treatment apparatus 1 of the second preferred embodiment is generally similar in overall configuration to that of the first preferred embodiment. A procedure for the treatment of a semiconductor wafer W in the heat treatment apparatus 1 of the second preferred embodiment is also similar to that of the first preferred embodiment. The second preferred embodiment differs from the first preferred embodiment in the form of the air escape mechanism.

Figure 9:
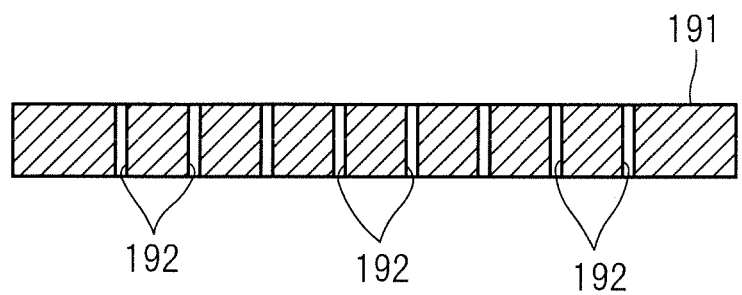
FIG. 9 is a sectional view of a light diffusion plate according to a second preferred embodiment.

FIG. 9 is a sectional view of a light diffusion plate 191 according to the second preferred embodiment. As in the first preferred embodiment, the light diffusion plate 191 is placed on the upper surface of the upper chamber window 63 provided in the upper portion of the chamber 6. In the second preferred embodiment, the light diffusion plate 191 is provided with a plurality of through holes 192 bored therein so as to extend through the light diffusion plate 191 between the upper and lower surfaces thereof. The diameter of the through holes 192 and the number of through holes 192 may be set as appropriate. It is however preferable that the through holes 192 are equally spaced in the surface of the light diffusion plate 191.

A mass of air entering between contact surfaces of the light diffusion plate 191 and the upper chamber window 63 is released from the through holes 192 to the outside. In other words, the through holes 192 provided in the light diffusion plate 191 function as an air escape mechanism that allows air remaining on the contact surfaces of the light diffusion plate 191 and the upper chamber window 63 to escape in the second preferred embodiment. The provision of the through holes 192 in the light diffusion plate 191 also restrains the occurrence of a phenomenon in which a thin layer of air is trapped between the light diffusion plate 191 and the upper chamber window 63 during the heat treatment of the semiconductor wafer W to prevent the sliding of the light diffusion plate 191 resulting from the air layer.

Third Preferred Embodiment

Next, a third preferred embodiment according to the present invention will be described. The heat treatment apparatus 1 of the third preferred embodiment is generally similar in overall configuration to that of the first preferred embodiment. A procedure for the treatment of a semiconductor wafer W in the heat treatment apparatus 1 of the third preferred embodiment is also similar to that of the first preferred embodiment. The third preferred embodiment differs from the first preferred embodiment in the form of the air escape mechanism.

Figure 10:
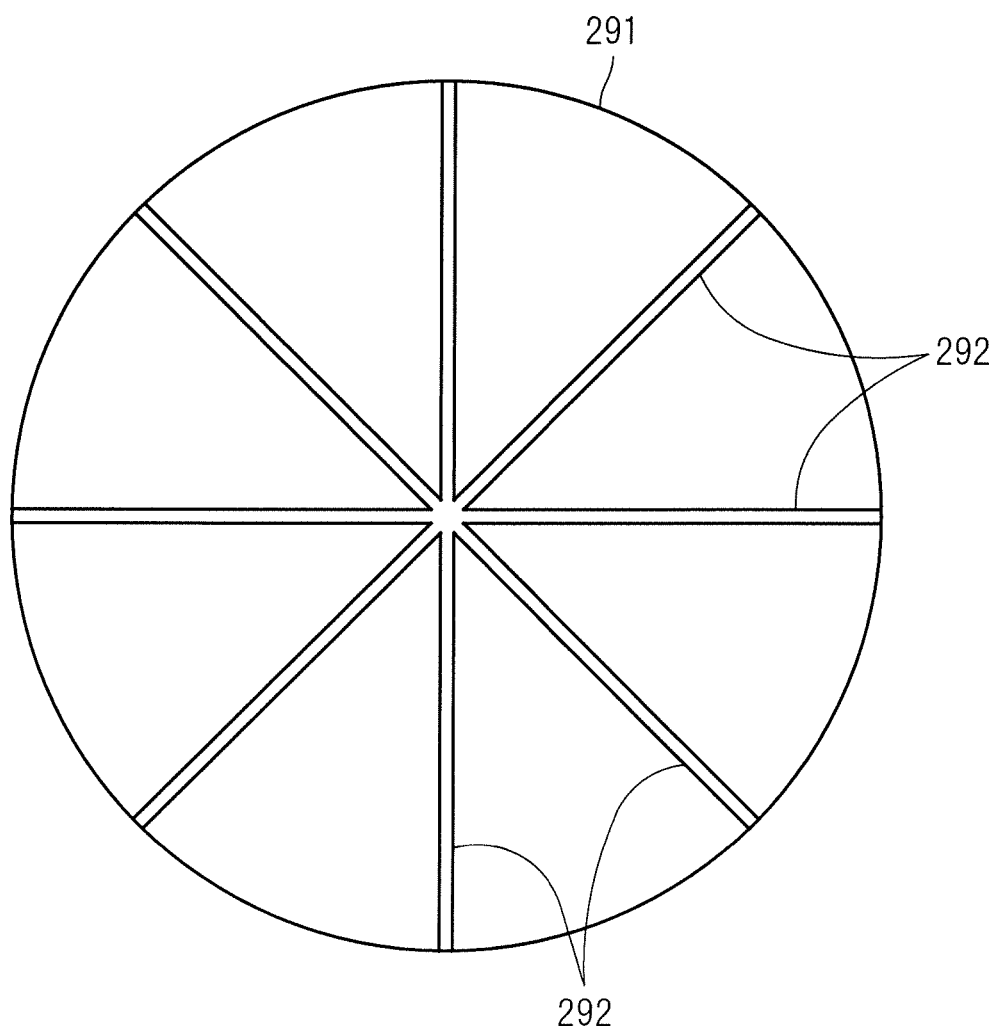
FIG. 10 is a plan view of a light diffusion plate according to a third preferred embodiment.

FIG. 10 is a plan view of a light diffusion plate 291 as seen from the lower surface side thereof according to the third preferred embodiment. As in the first preferred embodiment, the light diffusion plate 291 is placed on the upper surface of the upper chamber window 63 provided in the upper portion of the chamber 6. In the third preferred embodiment, a plurality of grooves 292 are formed in the lower surface of the light diffusion plate 291. The grooves 292 are provided in parallel to a main surface of the light diffusion plate 291. Each of the grooves 292 extends in a radial direction of the light diffusion plate 291 that is circular in shape. The width of the grooves 292 and the number of grooves 292 may be set as appropriate (although four grooves 292 each extending in a radial direction of the light diffusion plate 291 are provided in the third preferred embodiment).

A mass of air entering between contact surfaces of the light diffusion plate 291 and the upper chamber window 63 is released through the grooves 292 to the outside. In other words, the grooves 292 provided in the lower surface of the light diffusion plate 291 function as an air escape mechanism that allows air remaining on the contact surfaces of the light diffusion plate 291 and the upper chamber window 63 to escape in the third preferred embodiment. The provision of the grooves 292 in the lower surface of the light diffusion plate 291 also restrains the occurrence of a phenomenon in which a thin layer of air is trapped between the light diffusion plate 291 and the upper chamber window 63 during the heat treatment of the semiconductor wafer W to prevent the sliding of the light diffusion plate 291 resulting from the air layer.

Fourth Preferred Embodiment

Next, a fourth preferred embodiment according to the present invention will be described. The heat treatment apparatus 1 of the fourth preferred embodiment is generally similar in overall configuration to that of the first preferred embodiment. A procedure for the treatment of a semiconductor wafer W in the heat treatment apparatus 1 of the fourth preferred embodiment is also similar to that of the first preferred embodiment. In the fourth preferred embodiment, a plurality of light diffusion plates are provided in a stacked relation on the upper surface of the upper chamber window 63 for the purpose of attaining a stronger light diffusion effect.

Figure 11:
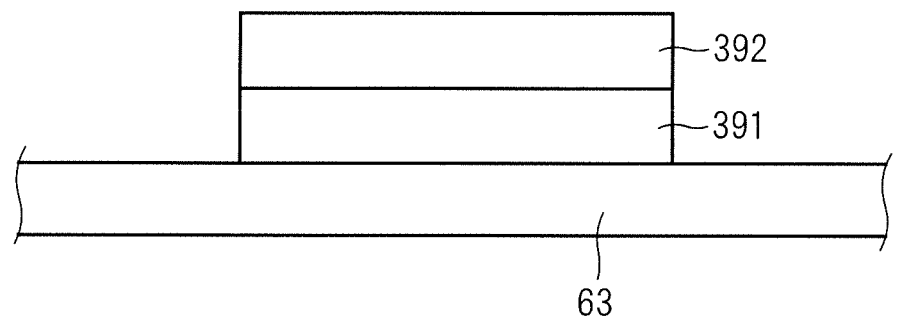
FIG. 11 is a view showing a plurality of light diffusion plates according to a fourth preferred embodiment.

FIG. 11 is a view showing the plurality of light diffusion plates according to the fourth preferred embodiment. Two light diffusion plates 391 and 392 are placed in a stacked relation on the upper surface of the upper chamber window 63 provided in the upper portion of the chamber 6. In this case, there is a danger that a mass of air enters not only between contact surfaces of the upper chamber window 63 and the light diffusion plate 391 but also between contact surfaces of the light diffusion plates 391 and 392.

A process similar to that of any one of the first to third preferred embodiments is applied to each of the two light diffusion plates 391 and 392. Thus, each of the light diffusion plates 391 and 392 is provided with an air escape mechanism that allows air to escape from between the contact surfaces of the upper chamber window 63 and the light diffusion plate 391 and from between the contact surfaces of the light diffusion plates 391 and 392. This restrains the occurrence of a phenomenon in which a thin layer of air is trapped not only between the upper chamber window 63 and the light diffusion plate 391 but also between the light diffusion plates 391 and 392 to prevent the sliding of the light diffusion plates 391 and 392.

<Modifications>

While the preferred embodiments according to the present invention have been described hereinabove, various modifications of the present invention in addition to those described above may be made without departing from the scope and spirit of the invention. For example, the lower surface of the light diffusion plate 90 is in the form of frosted glass in the first preferred embodiment. In place of or in addition to this, the upper surface of the upper chamber window 63 may be in the form of frosted glass. In this case, only a region of the upper surface of the upper chamber window 63 where the light diffusion plate 90 is to be placed is in the form of frosted glass. This also provides the upper chamber window 63 with the air escape mechanism for releasing air remaining on the contact surfaces of the light diffusion plate 90 and the upper chamber window 63 to produce effects similar to those of the first preferred embodiment.

In the first preferred embodiment, the blasting process is applied to the lower surface of the light diffusion plate 90 to provide the lower surface in the form of frosted glass. However, the present invention is not limited to this. For example, a grinding process may be performed so that the lower surface of the light diffusion plate 90 is in the form of frosted glass.

In the third preferred embodiment, the plurality of grooves 292 are provided in the lower surface of the light diffusion plate 291. In place of or in addition to this, a plurality of grooves may be provided in the upper surface of the upper chamber window 63. These grooves are provided in parallel to the main surface of the light diffusion plate 291. This also provides the upper chamber window 63 with the air escape mechanism for releasing air remaining on the contact surfaces of the light diffusion plate 291 and the upper chamber window 63 to produce effects similar to those of the third preferred embodiment.

Also, each of the grooves 292 is provided to extend in a radial direction of the light diffusion plate 291 that is circular in shape in the third preferred embodiment. However, the present invention is not limited to this. The grooves 292 may extend in any direction. For example, the grooves 292 may be provided to extend in parallel to each other.

In the fourth preferred embodiment, the two light diffusion plates 391 and 392 are stacked. However, the present invention is not limited to this. Three or more light diffusion plates may be provided in a stacked relation. Even if three or more light diffusion plates are stacked, the provision of an air escape mechanism similar to that of any one of the first to third preferred embodiments in each of the light diffusion plates prevents the sliding of each of the light diffusion plates.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiments, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) may be used as the continuous lighting lamps to perform the preheating.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with light, comprising:
    a chamber for receiving a substrate therein;
    a holder for holding said substrate in said chamber;
    a light irradiation part provided over said chamber and for irradiating said substrate held by said holder with light;
    a quartz window provided in an upper portion of said chamber and for transmitting light emitted from said light irradiation part therethrough into said chamber;
    a light diffusion plate placed on an upper surface of said quartz window and for diffusing the light emitted from said light irradiation part; and
    an air escape mechanism for allowing air remaining on contact surfaces of said quartz window and said light diffusion plate to escape, said air escape mechanism being provided in said quartz window or in said light diffusion plate,
    wherein said air escape mechanism is a through hole extending through said light diffusion plate between upper and lower surfaces thereof.

2. A heat treatment apparatus for heating a substrate by irradiating the substrate with light, comprising:
    a chamber for receiving a substrate therein;
    a holder for holding said substrate in said chamber;
    a light irradiation part provided over said chamber and for irradiating said substrate held by said holder with light;
    a quartz window provided in an upper portion of said chamber and for transmitting light emitted from said light irradiation part therethrough into said chamber; and
    a plurality of light diffusion plates provided in a stacked relation on an upper surface of said quartz window and for diffusing the light emitted from said light irradiation part,
    wherein said plurality of light diffusion plates are provided with an air escape mechanism for allowing air remaining on contact surfaces of said plurality of light diffusion plates to escape, and
    said air escape mechanism is a through hole extending through each of said plurality of light diffusion plates between upper and lower surfaces thereof.

* * * * *